United States Patent [19]

Au Coin et al.

[11] Patent Number: 4,883,769

[45] Date of Patent: Nov. 28, 1989

[54] METHOD OF MAKING A MULTIDIMENSIONAL QUANTUM-WELL ARRAY

[75] Inventors: Thomas R. Au Coin, Ocean Township, Ocean County; Walter D. Braddock, IV; Gerald J. Iafrate, both of Toms River, all of N.J.

[73] Assignee: The United States of America as represented by the Secretary of the Army, Washington, D.C.

[21] Appl. No.: 234,089

[22] Filed: Aug. 18, 1988

[51] Int. Cl.⁴ .................. H01L 21/20; H01L 21/225
[52] U.S. Cl. ............................ 437/110; 148/DIG. 3; 148/DIG. 15; 148/DIG. 57; 148/33.4; 156/610; 156/662; 357/16; 357/30; 437/126; 437/133; 437/935; 437/987; 437/161

[58] Field of Search ................. 148/DIG. 3, 4, 26, 33, 148/15, 56, 65, 72, 84, 95, 94, 110, 14, 157, 160, 169, 33.1, 33.4, 33.6; 156/610-615, 662; 357/16, 30; 437/81, 51, 54, 82, 111, 110, 107, 126, 133, 129, 174, 935, 936, 987, 161

[56] References Cited

U.S. PATENT DOCUMENTS

| | | | |
|---|---|---|---|
| 4,261,771 | 4/1981 | Dingle et al. | 437/107 |
| 4,503,447 | 3/1985 | Iafrate et al. | 357/16 |
| 4,637,122 | 1/1987 | Carney et al. | 437/107 |
| 4,654,090 | 3/1987 | Burnham et al. | 437/174 |
| 4,748,132 | 5/1988 | Fukuzawa | 437/129 |
| 4,751,946 | 6/1988 | Cibert et al. | 357/16 |
| 4,771,010 | 9/1988 | Epler et al. | 437/133 |

*Primary Examiner*—Brian E. Hearn
*Assistant Examiner*—William Bunch
*Attorney, Agent, or Firm*—Michael J. Zelenka; Roy E. Gordon

[57] ABSTRACT

Multidimensional quantum-well arrays are made by electron-beam lithographic patterning, followed by solid-state diffusion.

6 Claims, 1 Drawing Sheet

METHOD OF MAKING A MULTIDIMENSIONAL QUANTUM-WELL ARRAY

The invention described herein may be manufactured, used, and licensed by or for the Government for governmental purposes without the payment to us of any royalty thereon.

The invention relates in general to a method of making a multidimensional quantum-well array and in particular, to a method of making a high quality quantum-well array by electron-beam lithographic patterning, followed by solid-state diffusion.

BACKGROUND OF THE INVENTION

It has been known that semiconductor devices have a superlattice structure in which there is periodic variation in semiconductor composition, this having been shown and described, for example in U.S. Pat. Nos. 3,626,257 and 3,626,328, which were issued to Leo Esaki et al. on Dec. 7, 1971. The layered structure disclosed therein comprises a one-dimensional transport device that is formed either by doping or by alloying techniques.

In U.S. Pat. No. 4,103,312, issued to L. L. Chang et al. on June 25, 1978, there is disclosed a multilayered sandwich-type heterostructure comprising alternating layers of different semiconductor materials forming a periodic structure, and which is adapted to provide a three-dimensional confinement of electrons and holes in the device. A multilayered semiconductor heterostructure wherein potential wells are created between layers is disclosed in U.S. Pat. No. 4,257,055 issued to K. Hess et al. on Mar. 17, 1981. There, an inner layer exhibits high charge-carrier mobility and a relatively narrow band-gap characteristic, while the outer sandwich layers exhibit low charge mobilities and larger band gap characteristics and are operable such that, under quiescent conditions, the charge carriers of the outer sandwich layers reside in the inner layer that is due to the potential well that is created by the band-gap difference between the layers.

In U.S. Pat. No. 4,503,447, issued to G. J. Iafrate, T. R. AuCoin and D. K. Ferry on Mar. 5, 1985, a two-dimensional lateral superlattice structure within a single layer of semiconductor material was disclosed. The semiconductor device structure, including a plurality of multidimensional charge carrier confinement regions of a cylindrically formed semiconductor material exhibiting a relatively high charge-carrier mobility and a surrounding low band-gap semiconductor, that is laterally located in a single planar layer exhibiting a relatively low charge-carrier mobility and high band-gap, yields periodic regions that are adapted to act as quantum-well confinement regions for electrons. It is disclosed that the structures are formed, for example, by appropriate high-resolution lithography, physically etching the semiconductor to minimum feature sizes of the order of the deBroglie wavelength for a charge-carrier, for example, 250 Å in gallium arsenide, and followed by selective area epitaxial overgrowth.

SUMMARY OF THE INVENTION

The object of this invention is to provide a method of making multidimensional quantum-well arrays by other than physically patterning, etching, and subsequent epitaxial overgrowth.

It has now been found that the aforementioned object can be attained and a high-quality quantum-well array attained by electron-beam lithographic patterning, followed by solid-state diffusion.

More particular, according to the invention, a single-crystal wafer of gallium arsenide is used as the substrate onto which is epitaxially deposited a film of 5000 Å of gallium arsenide, a superlattice buffer (ten periods of 100 Å of gallium arsenide and 15 Å of gallium aluminum arsenide), followed by the epitaxial deposition of about 5000 Å of gallium arsenide, followed by the epitaxial deposition of about 1000 Å of gallium aluminum arsenide, followed by the epitaxial deposition of about 500 Å of gallium arsenide, and, then, followed by the deposition of 500 Å of silicon dioxide to form a layered structure.

An electron-beam sensitive resist, such as PMMA, is then spun onto the surface of the silicon dioxide film to a thickness of about 1000 Å and exposed to an electron beam focused properly and of sufficient flux to produce an array of circularly exposed areas of approximately 500 Å in diameter on the surface of the deposited silicon dioxide. Circular holes are then etched in the silicon dioxide (silica) layer by suitable plasma or wet chemical techniques. The e-beam resist is then stripped from the silica layer and the resulting sample placed in a suitable annealing furnace as for example, a rapid thermal annealer. The sample is heated to about 900° C. for 15 seconds. It is then cooled. During this thermal heat treatment, gallium atoms from the upper gallium arsenide film diffuse into the silica layer, where present, thereby causing gallium vacancies to occur in the upper gallium arsenide film. Aluminum then diffuses from the underlying gallium aluminum arsenide film into these gallium vacancies, thereby causing the in situ formation of gallium aluminum arsenide. This phenomenon leads to the precise formation of multidimensional quantum-well arrays without physically forming gallium arsenide hillocks at the heterostructure interface.

Figure 1:
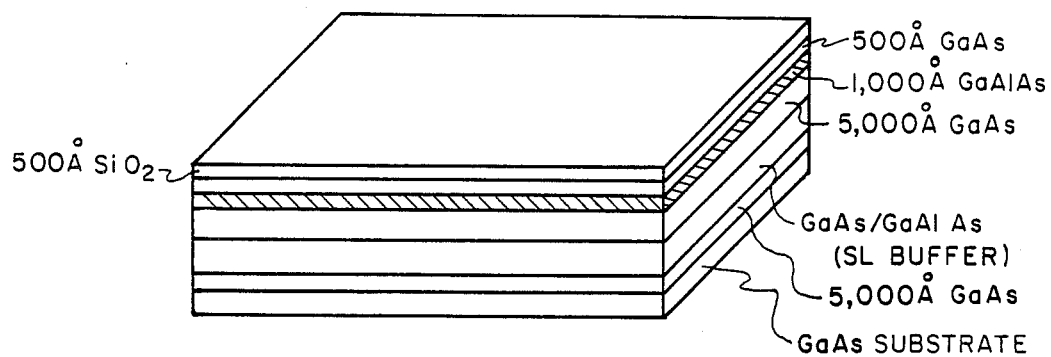
FIG. 1 is cross sectional view of the aforedescribed layered structure formed prior to the application of the electron-beam sensitive resist.
Figure 2:
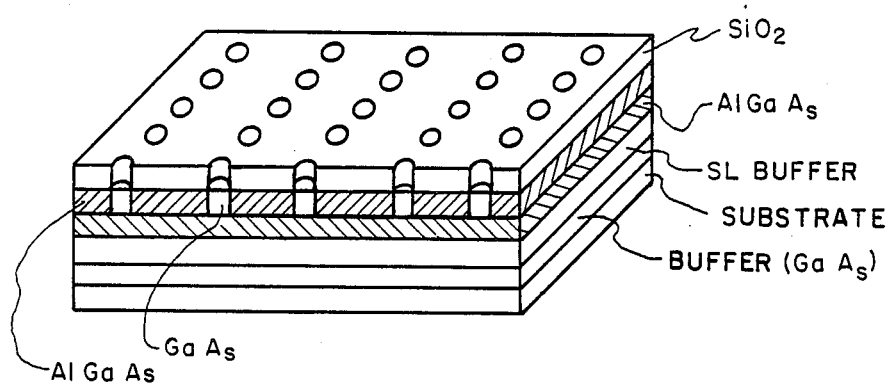
FIG. 2 is a cross sectional view of the multidimensional quantum-well array formed according to the method of the invention.

In the aforementioned method, the substrate is not limited to GaAs. That is, Si, sapphire, SiOx, InP, GaP, GaSb, AlAs, etc. may be used. Other substrates may be used as the growth technology associated with each substrate allows high quality material to be grown.

A superlattice or multi-quantum well structure may be used instead of the 500 Å layer of GaAs just below the $SiO_2$ capping this layer in the original structure. Furthermore, the thickness of this layer need not be 500 Å.

Silicon oxynitride may be used in lieu of the $SiO_2$ capping layer as an aid to diffusion. Other evaporated or CVD deposited dielectric materials may also be used.

Electron beam sensitive resist is not necessary to fabricate quantum dots by this process. The etching rate of $SiO_2$ is known to increase as the electron dose increases. If resist is not used a thin layer of metal should be evaporated over the $SiO_2$ to keep the the surface from charging. The metal layer should then be removed after the electron beam exposure to allow the etching step to proceed.

Other electron beam sensitive resists may be used in lieu of the example mentioned previously. In particular, multiple layer resists may be useful in etching and/or pattern definition. A metal (e.g. Al) may be included in this multilayer resist coating to prevent charging and aid in masking during etching. Positive or Negative resists may be used.

A negative resist process will have certain advantages that will aid in device fabrication. In particular interdiffusion of the heterostructure will occur more readily where the electron beam has exposed the surface. Exposure by the electron beam causes an increase in the defect density within the semiconductor material. This increased defect density will cause diffusion to occur with a lower activation energy.

This process applies to any material system where gallium is present. In particular, quantum dots may be fabricated from GaAs/InGaAs, InGaAs/AlGaAs, GaSb/InSb, etc.

Quantum wires and three dimensional arrays of quantum dots may be fabricated using this process. Waveguide structures, diffraction gratings, and interferometers may also be fabricated using this process.

We wish it to be understood that we do not desire to be limited to the exact details of construction as described for obvious modifications will occur to a person skilled in the art.

What is claimed is:

1. Method of making a multidimensional quantum-well array from a single crystal wafer of gallium arsenide as the substrate including the steps of:
   (A) epitaxially depositing a film of about 5000 Å of gallium arsenide onto the top surface of the substrate,
   (B) depositing thereover a superlattice buffer of ten periods of approximately 100 Å of gallium arsenide and 15 Å of gallium aluminum arsenide,
   (C) epitaxially depositing about 5000 Å of gallium arsenide onto the superlattice buffer,
   (D) epitaxially depositing about 1000 Å of gallium aluminum arsenide thereover,
   (E) epitaxially depositing about 500 Å of gallium arsenide thereover,
   (F) depositing about 500 Å of silicon dioxide thereover,
   (G) spinning an electron-beam sensitive resist onto the silicon dioxide film to a thickness of about 1000 to 2000 Å and exposing the resist to an electron beam focused properly and of sufficient flux to produce an array of circularly exposed areas of about 500 Å diameter,
   (H) developing the exposed areas to open circular holes of about 500 Å in diameter on the surface of the deposited silicon dioxide,
   (I) etching circular holes in the silicon dioxide layer,
   (J) stripping the e-beam resist from the silica layer and placing the resulting sample in a suitable annealing furnace, and
   (K) heating the sample to about 900° C. for about 15 seconds and then cooling.

2. Method according to claim 1 wherein the electron beam sensitive resist is PMMA.

3. Method according to claim 1 wherein the circular holes are etched in the silicon dioxide layer by plasma techniques.

4. Method according to claim 1 wherein the circular holes are etched in the silicon dioxide layer by wet chemical techniques.

5. Method according to claim 1 wherein the annealing furnace is a rapid thermal annealer.

6. Method of making a multidimensional quantum-well array from a single crystal wafer of gallium arsenide as the substrate including the steps of:
   (A) epitaxially depositing a film of about 5000 Å of gallium arsenide onto the top surface of the substrate,
   (B) depositing thereover a superlattice buffer of ten periods of approximately 100 Å of gallium arsenide and 15 Å of gallium aluminum arsenide,
   (C) epitaxially depositing about 5000 Å of gallium arsenide onto the superlattice buffer,
   (D) epitaxially depositing about 1000 Å of gallium aluminum arsenide thereover,
   (E) epitaxially depositing about 500 Å of gallium arsenide thereover,
   (F) depositing about 1000 to 3000 Å of silicon dioxide thereover,
   (G) spinning an electron-beam resist of PMMA onto the silicon dioxide film to a thickness of about 500 Å and exposing the resist to an electron beam focused properly and a sufficient flux to produce an array of circularly exposed areas of about 500 Å diameter,
   (H) developing the exposed areas to open circular holes of about 500 Å diameter on the surface of the deposited silicon dioxide,
   (I) etching circular holes in the silicon dioxide layer by wet chemical techniques,
   (J) stripping the e-beam resist from the silica layer and placing the resulting sample in a rapid thermal annealer, and
   (K) heating the sample to about 900° C. for about 15 seconds and then cooling.

* * * * *

UNITED STATES PATENT AND TRADEMARK OFFICE
CERTIFICATE OF CORRECTION

PATENT NO. : 4,883,769

DATED : November 28, 1989

INVENTOR(S) : Thomas R. AuCoin, Walter D. Braddock, IV, Gerald J. Iafrate

It is certified that error appears in the above-identified patent and that said Letters Patent is hereby corrected as shown below:

Change Serial Number

From: "234,089"    To: --07/234,069--

Signed and Sealed this

Sixth Day of November, 1990

Attest:

HARRY F. MANBECK, JR.

Attesting Officer

Commissioner of Patents and Trademarks